United States Patent
Byeon et al.

(10) Patent No.: US 7,671,923 B2
(45) Date of Patent: Mar. 2, 2010

(54) DIGITAL PROCESSING SYSTEM AND METHOD FOR TRACKING SUBCARRIER INCLUDED IN VIDEO SIGNAL

(75) Inventors: Heo-Jin Byeon, Hwaseong-si (KR);
Kyoung-Mook Lim, Hwaseong-si (KR);
Hyung-Jun Lim, Suwon-si (KR);
Seh-Woong Jeong, Seoul (KR);
Jae-Hong Park, Seongnam-si (KR);
Sung-Cheol Park, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 1107 days.

(21) Appl. No.: 11/311,697

(22) Filed: Dec. 19, 2005

(65) Prior Publication Data

US 2006/0152623 A1  Jul. 13, 2006

(30) Foreign Application Priority Data

Dec. 20, 2004  (KR) .................. 10-2004-0108823

(51) Int. Cl.
*H04N 9/45* (2006.01)
*H04N 9/455* (2006.01)

(52) U.S. Cl. ....................... 348/507; 348/505
(58) Field of Classification Search ............. 348/500, 348/505, 507–509, 536–539; 375/293, 294, 375/327, 354, 362, 373, 376; *H04N 5/04, H04N 9/45, 9/455, 9/44*
See application file for complete search history.

(56) References Cited

U.S. PATENT DOCUMENTS

| | | | |
|---|---|---|---|
| 4,024,572 A | 5/1977 | Derenbecher, Jr. ............ 358/18 |
| 4,366,451 A * | 12/1982 | Kowal ........................ 348/505 |
| 4,694,326 A | 9/1987 | Demmer ...................... 358/19 |
| 4,734,757 A | 3/1988 | Akiyama | |
| 4,758,879 A | 7/1988 | Matthies | |
| 5,166,779 A | 11/1992 | Moyer | |
| 5,621,477 A | 4/1997 | Demmer ..................... 348/639 |
| 5,920,228 A | 7/1999 | Soga et al. | |
| 6,014,176 A * | 1/2000 | Nayebi et al. ............... 348/539 |
| 2002/0021177 A1 | 2/2002 | Uto | |
| 2003/0072401 A1 | 4/2003 | Den Besten | |

FOREIGN PATENT DOCUMENTS

| | | |
|---|---|---|
| JP | 05-091522 | 4/1993 |
| JP | 11-008857 | 12/1999 |
| KR | 0132984 | 4/1998 |

OTHER PUBLICATIONS

Notice of Office Action dated Dec. 15, 2008 in corresponding Taiwanese Patent Application No. 094145213.

* cited by examiner

*Primary Examiner*—Sherrie Hsia
(74) *Attorney, Agent, or Firm*—F. Chau & Associates, LLC

(57) ABSTRACT

A digital processing system and method for tracking a subcarrier included in a video signal are provided, where a phase comparator tracks the phase of a color burst signal based on predetermined supposed phases, Y/C separation and demodulation are carried out based on a compensation phase that is updated by a phase compensator in response to the tracked phase, and the Y/C separation and demodulation are performed based on a compensation frequency determined by a frequency compensator by checking short-term and long-term variations in the updated compensation phase.

20 Claims, 5 Drawing Sheets

ONE HORIZONTAL SCAN PERIOD

DIGITAL PROCESSING SYSTEM AND METHOD FOR TRACKING SUBCARRIER INCLUDED IN VIDEO SIGNAL

CROSS-REFERENCE TO RELATED APPLICATION

This application claims foreign priority under 35 U.S.C. § 119 to Korean Patent Application No. 10-2004-0108823, filed on Dec. 20, 2004 in the Korean Intellectual Property Office, the disclosure of which is incorporated herein in its entirety by reference.

BACKGROUND OF THE INVENTION

1. Field of the Invention

The present disclosure relates to a video signal processing system and method, and more particularly, to a system and method for tracking a subcarrier or a color burst signal.

2. Description of the Related Art

A display system, such as a TV set or a personal computer monitor, includes a device for processing video signals input thereto. FIG. 1 is a block diagram of a conventional video signal processing system 100, including an analog-to-digital converter 110, a burst separator 120, a phase comparison and frequency compensation unit 130, and a Y/C separating and demodulating unit 140.

The analog-to-digital converter 110 converts an input analog video signal into a digital signal and outputs the digital signal to the burst separator 120. The input analog video signal can be a CVBS (Composite Video Blanking Sync) signal. The CVBS signal 200 includes a front porch signal 210, a horizontal synchronization level signal 220, a back porch signal 230, and an active video signal 240, as shown in FIG. 2.

The burst separator 120 extracts a color burst signal in the back porch signal from the converted digital signal. The phase comparison and frequency compensation unit 130 tracks a burst signal from the color burst signal extracted by the burst separator 120. The Y/C separating and demodulating unit 140 extracts a luminance signal Y and a chrominance signal C from the converted digital signal using the frequency or phase of the burst signal tracked by the phase comparison and frequency compensation unit 130 interpolates the luminance signal and the chrominance signal and generates color signals suitable for a display, such as a Liquid Crystal Display (LCD). Specifically, the Y/C separating and demodulating unit 140 generates the color signals in the form of RGB color signals, or a luminance signal Y and chrominance signals Cb and Cr, in accordance with the particular standard used by the display. Images corresponding to the color signals are displayed on the display for a user to see. The conventional video signal processing system 100 is described in detail in U.S. Pat. No. 5,355,171.

The phase comparison and frequency compensation unit 130 tracks the burst signal using a Phase Locked Loop (PLL) or a loop filter. The burst signal includes information for extracting the chrominance signal based on a modulation scheme. The phase of the burst signal included in the CVBS signal may represent chrominance information in the National Television System Committee/Phase Alteration By Line (NTSC/PAL) system, and a variation in the frequency $F_{SC}$ of the burst signal may represent the chrominance information in the SECAM (Sequential Couleur A Memoire) system. Consequently, the chrominance signal cannot be obtained when phase information or frequency information tracked by the phase comparison and frequency compensation unit 130 contains errors.

However, the conventional phase comparison and frequency compensation unit 130 tracks one of the phase information and frequency information of the burst signal. The currently tracked phase or frequency information is compared to phase or frequency information tracked in a previous horizontal scan period. When there is a difference between the currently tracked phase information and the previously tracked phase information, the tracked information is updated to yield new information compensated by the difference. Here, even if the tracked phase corresponds to the phase of the burst signal at the starting point of the burst signal, it may not coincide with the phase of the burst signal at the end point of the burst signal because the frequency of the tracked information may not correspond to the frequency of the burst signal.

SUMMARY OF THE INVENTION

The present disclosure provides a digital video signal processing system, which tracks and compensates the phase of a color burst signal or subcarrier based on predetermined supposed phases, and compensates frequency of the color burst signal in response to continuity and accumulated quantity of the tracked phase.

The present disclosure also provides a digital video signal processing method for tracking and compensating the phase and frequency of the color burst signal or subcarrier.

According to an aspect of the present disclosure, there is provided a device for tracking a subcarrier of a video signal, including a phase comparator, a phase compensator and a frequency compensator. The phase comparator tracks the phase of a burst signal based on predetermined supposed phases. The phase compensator determines a compensation phase in response to the tracked phase. The frequency compensator determines a compensation frequency in response to a variation in the compensation phase.

The phase comparator tracks the phase of the burst signal in consideration of a frequency variation caused by the compensation frequency. The predetermined supposed phases include a positive value of the compensation phase, a negative value of the compensation phase, and zero, determined based on the compensation phase.

The phase compensator increases a count and determines that the compensation phase is updated in response to the increased count value when the tracked phase is identical to a previously tracked phase, and resets the count when the tracked phase is not identical to the previously tracked phase. The phase compensator determines the compensation phase according to whether the tracked phase is zero or not, and then tracks the next phase when the count value is larger than a threshold value, and tracks the next phase without determining the compensation phase when the count value is not larger than the threshold value. The phase compensator decreases the compensation phase down to a predetermined minimum value when the tracked phase is zero, and increases the compensation phase up to a predetermined maximum value when the tracked phase is not zero.

The frequency compensator recognizes that there is a frequency error and generates a first compensation frequency reflecting a short-term variation in the compensation phase when the tracked phase is not zero and the count value exceeds a threshold value. The frequency compensator generates a second compensation frequency reflecting a long-term variation in the compensation phase when the count value is larger than the threshold value and the accumulated quantity of the compensation phase exceeds a threshold phase.

According to another aspect of the present disclosure, there is provided a video signal processing system including an analog-to-digital converter, a burst separator, a subcarrier tracking unit, and a Y/C separating and demodulating unit. The analog-to-digital converter converts an input analog video signal into a digital signal. The burst separator extracts a burst signal from the digital signal. The subcarrier tracking unit tracks the phase of the extracted burst signal based on predetermined supposed phases, updates a compensation phase, and checks short-term and long-term variations in the compensation phase to determine a compensation frequency. The Y/C separating and demodulating unit separates a luminance signal and a chrominance signal from the digital signal based on the compensation phase and the compensation frequency, and generates a color signal for driving a display.

According to another aspect of the present disclosure, there is provided a method for tracking a subcarrier of a video signal, including tracking the phase of a burst signal based on predetermined supposed phases, determining a compensation phase in response to the tracked phase, and determining a compensation frequency in response to a variation in the compensation phase.

According to another aspect of the present disclosure, there is provided a video signal processing method including converting an input analog video signal into a digital signal, extracting a burst signal from the digital signal, tracking the phase of the extracted burst signal based on predetermined supposed phases and updating a compensation phase, checking short-term and long-term variations in the compensation phase to determine a compensation frequency, and separating a luminance signal and a chrominance signal from the digital signal based on the compensation phase and the compensation frequency.

BRIEF DESCRIPTION OF THE DRAWINGS

The above and other features and advantages of the present disclosure will become more apparent by describing in detail exemplary embodiments thereof with reference to the attached drawings, in which.

DETAILED DESCRIPTION OF PREFERRED EMBODIMENTS

Figure 1:
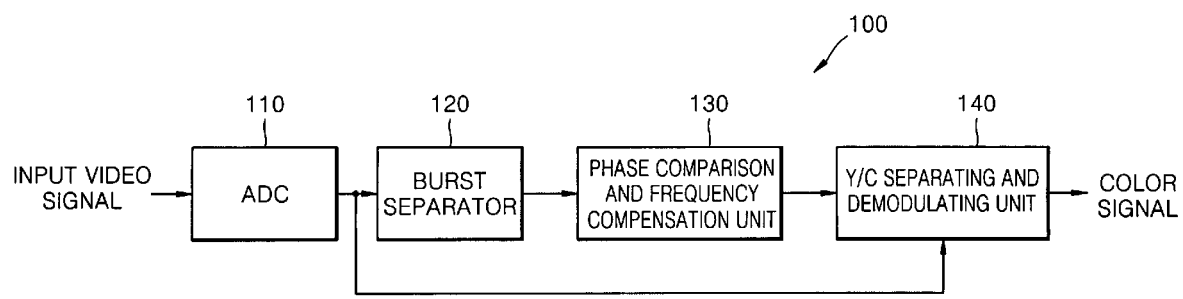
FIG. 1 is a block diagram of a conventional video signal processing system.

Exemplary embodiments of the present disclosure will now be described more fully with reference to the accompanying drawings, in which exemplary embodiments of the disclosure are shown. The disclosure may, however, be embodied in many different forms and should not be construed as being limited to the embodiments set forth herein; rather, these embodiments are provided so that this disclosure will be thorough and complete, and will fully convey the concept of the disclosure to those skilled in the art. Throughout the drawings, like reference numerals may refer to like elements.

Figure 3:
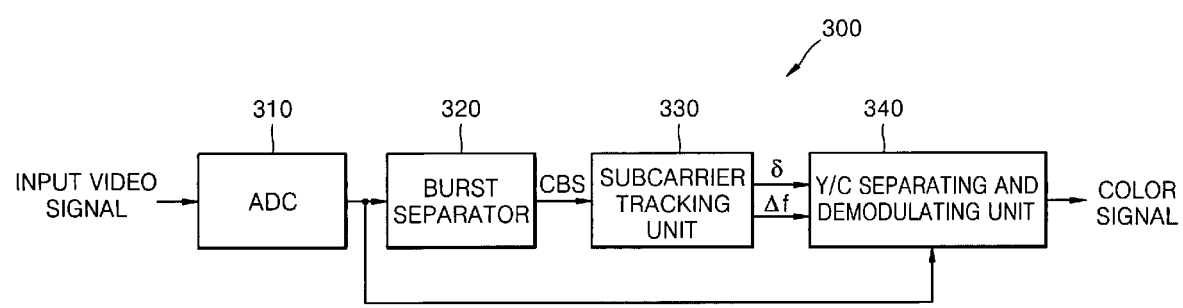
FIG. 3 is a block diagram of a video signal processing system according to an embodiment of the present disclosure.

FIG. 3 is a block diagram of a video signal processing system 300 according to an embodiment of the present disclosure. The video signal processing system 300 includes an analog-to-digital converter (ADC) 310, a burst separator 320, a subcarrier tracking unit 330, and a Y/C separating and demodulating unit 340.

Figure 2:
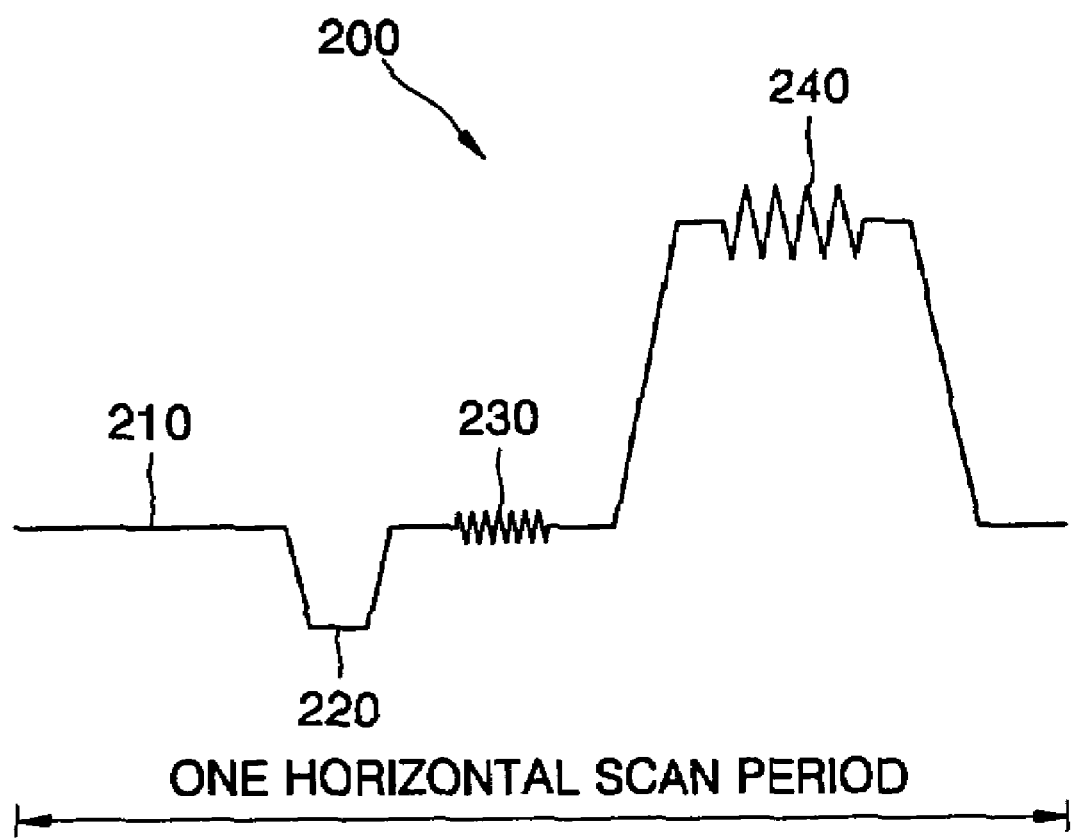
FIG. 2 is a waveform diagram of a CVBS signal.

The video signal processing system 300 tracks and compensates the phase and frequency of a color burst signal or subcarrier included in the back porch signal portion of an input analog video signal. The Y/C separating and demodulating unit 340 is operated in response to a compensation phase $\delta$ and a compensation frequency $\Delta f$ generated by the subcarrier tracking unit 330. The input analog video signal can be the CVBS signal 200 as shown in FIG. 2.

The analog-to-digital converter 310 samples the input analog video signal to convert it into a digital signal and outputs the converted digital signal to the burst separator 320. The burst separator 320 extracts the color burst signal CBS from the converted digital signal.

The subcarrier tracking unit 330 tracks the phase and frequency of the extracted color burst signal CBS, determines the compensation phase $\delta$ estimated based on predetermined supposed phases $\theta_I$, and checks short-term and long-term variations in the compensation phase $\delta$ to decide the compensation frequency $\Delta f$. The compensation phase $\delta$ and compensation frequency $\Delta f$ determined by the subcarrier tracking unit 330 are updated for each horizontal scan period.

The Y/C separating and demodulating unit 340 separates a luminance signal Y and a chrominance signal C from the digital signal based on the compensation phase $\delta$ and compensation frequency $\Delta f$ determined by the subcarrier tracking unit 330, and generates color signals for driving a display. The Y/C separating and demodulating unit 340 generates the color signals in the form of RGB color signals, or a luminance signal Y and chrominance signals Cb and Cr, based on the standard used by a given display, such as a liquid crystal display (LCD), for example. Images corresponding to the color signals are displayed on the display for a user to see.

Figure 4:
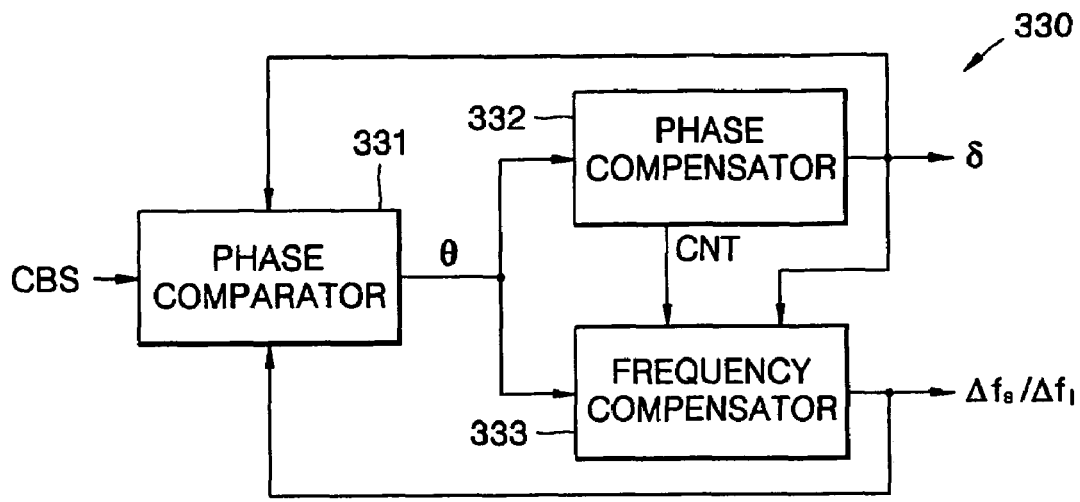
FIG. 4 is a block diagram of the subcarrier tracking circuit of FIG. 3.

The subcarrier tracking unit 330 is shown in FIG. 4 in detail. Referring to FIG. 4, the subcarrier tracking unit 330 includes a phase comparator 331, a phase compensator 332, and a frequency compensator 333. The operation of the subcarrier tracking unit 330 will now be explained with reference to FIGS. 4 and 6.

The phase comparator 331 tracks the phase of the color burst signal CBS extracted by the burst separator 320 and outputs the tracked phase $\theta$. The phase compensator 332 determines the compensation phase $\delta$ in response to the tracked phase $\theta$.

Figure 5:
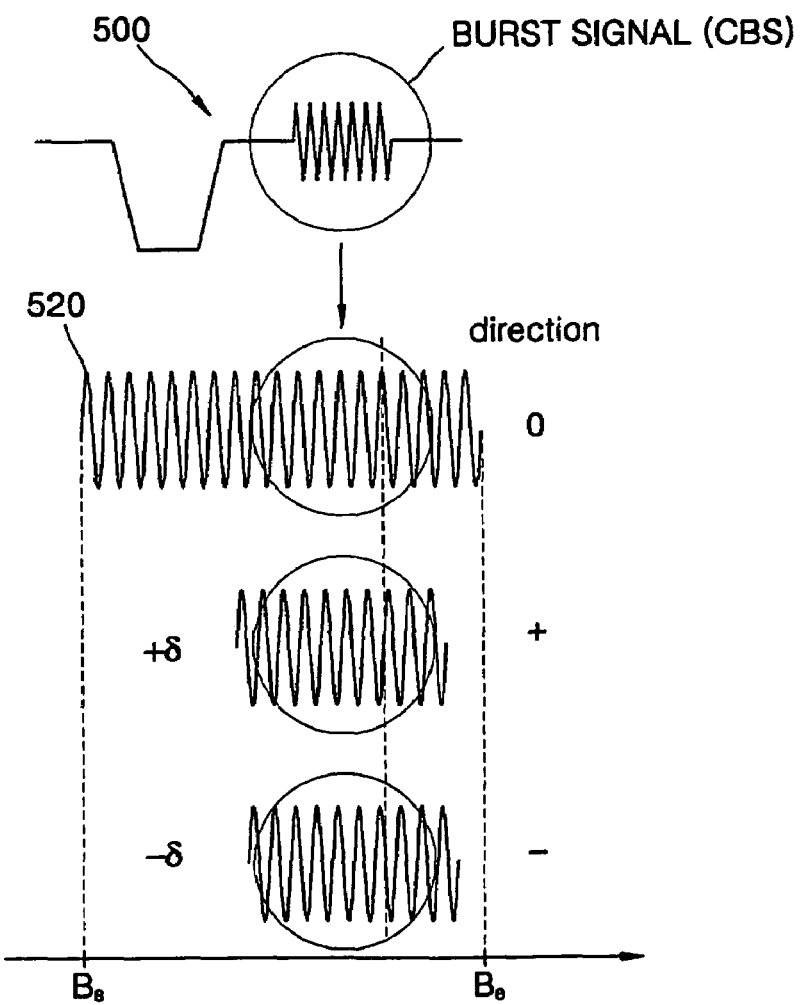
FIG. 5 is a waveform diagram for explaining a quantity of compensation phase for a color burst signal.
Figure 6:
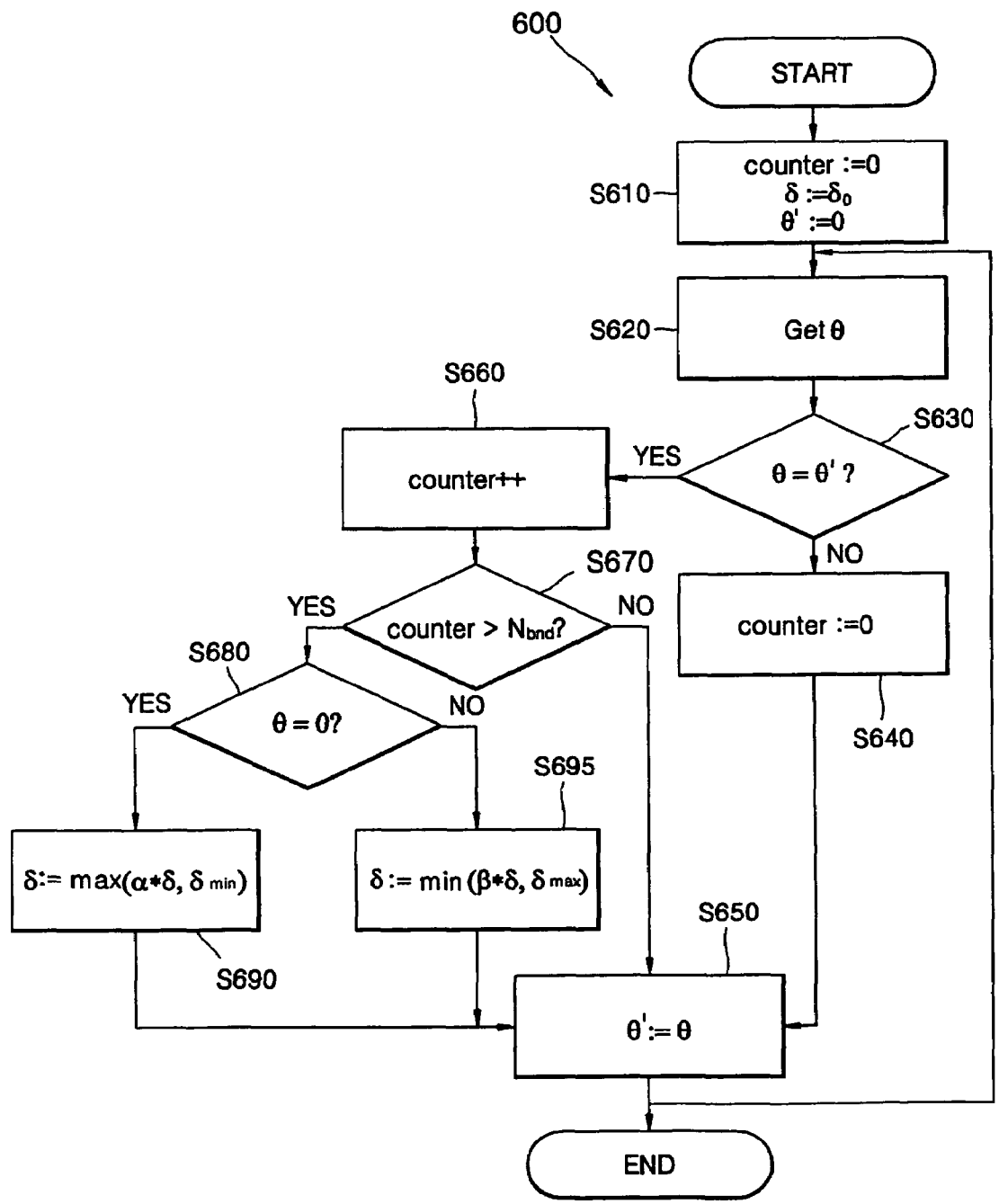
FIG. 6 is a flowchart showing the operation of the subcarrier tracking circuit.

As shown in FIG. 6, a method of operation for a subcarrier tracking circuit is indicated generally by the reference numeral 600. Specifically, in the phase compensator 332, a predetermined counter (not shown) and the previous value $\theta'$ of the tracked phase $\theta$ are reset, and the compensation phase $\delta$ is set to an arbitrary initial value $\delta_0$ (S610 of FIG. 6). The phase comparator 331 receives the color burst signal CBS and tracks the phase of the color burst signal CBS based on the predetermined supposed phases $\theta_i$ (S620 of FIG. 6). That is, the phase comparator 331 calculates correlation of the color burst signal CBS and estimated burst signals respectively having a positive value $+\delta$ of the compensation phase $\delta$, a negative value $-\delta$ of the compensation phase $\delta$, and a value of zero, respectively, based on the compensation phase $\delta$ estimated by the phase compensator 332. The compensation phase having the largest correlation is estimated as the phase of the color burst signal CBS 500 of FIG. 5.

For example, it is supposed that there are three signals respectively having phase differences of zero, +δ, and −δ from the estimated burst signal 520, as shown in FIG. 5. The frequency $F_{SC}$ of the estimated burst signal 520 is determined in response to the compensation frequency Δf estimated by the frequency compensator 333. Correlation of each of the estimated burst signals 520 respectively having the supposed phases $\theta_i$ and the input burst signal CBS is calculated by Equation 1, and the phase corresponding to the largest correlation is output as the tracked phase θ (S620 of FIG. 6).

$$\theta = \underset{\theta_i}{\mathrm{argmax}} \left( \sum_{j=B_s}^{B_e} (S_j \cdot \sin(\omega(j - B_s) + \theta_i + \phi)) \right) \quad [\text{Equation 1}]$$

$$\{\theta_0 = 0, \theta_1 = +\delta, \theta_2 = -\delta\}$$

In Equation 1, j is the digital sample index, S is the magnitude of the color burst signal CBS, $B_s$ to $B_e$ represents the color burst period, ω is the angular velocity $2\pi F_{SC}$ of the estimated burst signal 520, and φ means the phase at the color burst starting point $B_s$. Here, φ uses an appropriate value calculated in response to the kind of video signal standard, such as NTSC, PAL or SECAM. For example, in the case of PAL, π/4 is added to or subtracted from the currently tracked color burst signal CBS as the value of φ for every horizontal scan line in order to reflect PAL switching on the tracking of the color burst signal.

The phase compensator 332 determines the compensation phase δ in response to the phase θ tracked by the phase comparator 331 (S630 through S695 of FIG. 6). The phase compensator 332 compares the tracked phase θ to the previously tracked phase θ' (S630 of FIG. 6). When the tracked phase θ is not identical to the previously tracked phase θ', the phase comparator 332 resets a count (S640 of FIG. 6). Here, the tracked phase θ is updated into the previously tracked phase θ' (S650 of FIG. 6), and tracking for determining the compensation phase δ of the next horizontal scan period is carried out (S630 through S695 of FIG. 6). The phase compensator 332 increases the count and determines update of the compensation phase δ in response to the increased count value CNT when the tracked phase θ is identical to the previously tracked phase θ' (S660 through S695 of FIG. 6).

The phase compensator 332 compares the count value CNT to a threshold value $N_{bnd}$ (S670 of FIG. 6). When the count value CNT is not larger than the threshold value $N_{bnd}$, the phase compensator 332 updates the tracked phase θ into the previously tracked phase θ' (S650 of FIG. 6) and carries out tracking for determining the compensation phase δ of the next horizontal scan period (S630 through S695 of FIG. 6). When the count value CNT is larger than the threshold value $N_{bnd}$, the phase compensator 332 determines the compensation phase δ according to whether the tracked phase θ is zero or not (S680 through S695 of FIG. 6). The threshold value $N_{bnd}$ is set to a value appropriate for phase compensation.

A method of determining the compensation phase δ will now be explained. The phase compensator 332 decreases the compensation phase δ down to a predetermined minimum value $\delta_{min}$ when the tracked phase θ is zero (S690 of FIG. 6), but increases the compensation phase δ up to a predetermined maximum value $\delta_{max}$ when the tracked phase θ is not zero (S695 of FIG. 6). When the currently tracked phase θ is 1, a coefficient α is 0.5, the minimum value $\delta_{min}$ is 0.4, and step S690 continues. For example, the compensation phase δ is gradually reduced such as 1→0.5→0.4→0.4 to reach the minimum value 0.4. When the currently tracked phase θ is 1, a coefficient β is 2, the maximum value $\delta_{max}$ is 3, and step S695 continues. For example, the compensation phase δ is gradually increased such as 1→2→3→3 to reach the maximum value 3. The coefficient α is larger than 0 and smaller than 1. The coefficient α decreases a variation in the compensation phase δ to reduce the tracking speed when it is close to 1 but increases the variation in the compensation phase δ to improve the tracking speed when it is close to 0. The coefficient β is larger than 1. The coefficient β decreases the variation in the compensation phase δ such that δ becomes insensitive to a phase variation when it is close to 1. The coefficient β makes the compensation phase δ sensitive to the phase variation as it increases.

That is, when the phase θ tracked by Equation 1 is continuous as +δ or −δ, it is determined that the current compensation quantity is too small to track the phase of the burst signal and thus the compensation phase δ is increased. When the tracked phase θ is continuous as 0, it is determined that the phase of the burst signal has been stably tracked and thus the compensation phase δ is reduced. In other words, the compensation phase δ is decreased in step S690 as a phase error decreases between the estimated burst signal 520 and the input burst signal CBS, and the compensation phase δ is increased as the phase error increases. That is, the compensation phase δ is decreased to enable accurate tracking estimation because the more accurate the phase of the estimated burst signal 520, the smaller the phase error.

In the meantime, the frequency compensator 333 determines the compensation frequency Δf in response to a variation in the compensation phase δ determined by the phase compensator 332. The frequency compensator 333 carries out frequency tracking using continuity and accumulated quantity of the compensation phase δ.

Specifically, when the phase θ tracked by the phase comparator 331 is not zero but continuous as +δ or −δ, the frequency compensator 333 determines that there is a frequency error and decides the first compensation frequency $\Delta f_S$ as shown by Equation 2. In Equation 2, $v_1$ is a short-term variation frequency compensation factor, which is larger than 0 and smaller than 1. The short-term variation frequency compensation factor determines the quantity of phase error of the current horizontal scan period, which is reflected in frequency compensation. In addition, direction represents the direction value of the compensation phase δ having the value 1, +1 or 0, and NUMSAM means the number of digital samples in one horizontal scan line. As the short-term variation compensation factor $v_1$ approaches 1, the entire current error of the current horizontal scan period is reflected on frequency compensation and thus the frequency tracking speed is increased. On the other hand, as the short-term variation compensation factor $v_1$ approaches 0, the current phase error is less reflected in frequency compensation and thus the frequency tracking speed decreases.

$$\Delta f_s = v_1 \times \frac{\text{direction} \cdot \delta}{NUMSAM} \quad [\text{Equation 2}]$$

It can be determined whether the tracked phase θ is continuous as +δ or −δ according to whether the count value CNT of the phase compensator 332 is larger than a threshold value THV. Accordingly, the frequency compensator 333 recognizes that there is a frequency error when the tracked phase θ is not zero and the count value CNT is larger than the threshold value THV, and generates a first compensation frequency $\Delta f_S$ reflecting the short-term variation of the phase compensation δ. The threshold value THV is set to a value appropriate for frequency compensation.

When the phase error is not compensated for even by the first compensation frequency $\Delta f_S$ and a predetermined period of time lapses, the frequency compensator 333 determines whether the accumulated quantity of the compensation phase δ during the predetermined period of time is larger than a threshold phase $T_{phase}$ to decide a second compensation frequency Δfl, as shown by Equation 3. In Equation 3, $v_2$ is a long-term variation frequency compensation factor, which is larger than 0 but smaller than 1. Based on the value $v_2$, the quantity of phase error of N horizontal scan periods, which is reflected in frequency compensation, is determined. The threshold phase $T_{phase}$ is set to a value appropriate for frequency compensation. In Equation 3, i is the horizontal scan line index, $direction_i$ represents the direction value of the compensation phase δ having the value 1, +1, or 0 for a corresponding horizontal scan line, and $NUMSAM_i$ means the number of digital samples in a corresponding horizontal scan line.

$$\Delta f_1 = v_2 \times \frac{\sum_{i=1}^{N} direction_i \cdot \delta_i}{\sum_{i=1}^{N} NUMSAM_i}$$ [Equation 3]

$$\left| \sum_{i=1}^{N} direction_i \cdot \delta_i \right| > T_{phase}$$

That is, the frequency compensator 333 generates the second compensation frequency Δfl reflecting the long-term variation of the compensation phase δ when the count value CNT of the phase compensator 332 is larger than the threshold value THV and the accumulated quantity of the compensation phase δ exceeds the threshold phase $T_{phase}$.

As described above, in the video signal processing system 300 according to the present disclosure, the phase comparator 331 tracks the phase θ of the color burst signal CBS based on the supposed phases $θ_j$, and Y/C separation and demodulation are carried out based on the compensation phase δ, which is updated by the phase compensator 332 in response to the tracked phase θ. Furthermore, Y/C separation and demodulation are performed in response to the compensation frequency Δf determined by the frequency compensator 333 by checking short-term and long-term variations in the updated compensation phase δ.

As described above, the video signal processing system of the present disclosure carries out phase tracking based on the supposed phases of the color burst signal, and thus the quantity of calculations is reduced. Furthermore, frequency compensation is carried out when it is determined that phase compensation is unsuccessful so that accurate, error-free chrominance information can be obtained. This improves color reproducibility of a display.

While the present invention has been particularly shown and described with reference to exemplary embodiments thereof, it will be understood by those of ordinary skill in the pertinent art that various changes in form and details may be made therein without departing from the spirit and scope of the present invention as defined by the following claims.

What is claimed is:

1. A device for tracking a subcarrier of a video signal, comprising:
    a phase comparator for tracking the phase of a burst signal based on predetermined supposed phases;
    a phase compensator in signal communication with the phase comparator for determining a compensation phase in response to the tracked phase; and
    a frequency compensator in signal communication with the phase comparator for determining a compensation frequency in response to a variation in the compensation phase.

2. The device of claim 1, wherein the phase comparator tracks the phase of the burst signal in consideration of a frequency variation caused by the compensation frequency.

3. The device of claim 1, wherein the predetermined supposed phases are determined based on the compensation phase.

4. The device of claim 3, wherein the predetermined supposed phases include a positive value of the compensation phase, a negative value of the compensation phase, and zero.

5. The device of claim 1, wherein the phase compensator increases a count and determines that the compensation phase is updated in response to the increased count value when the tracked phase is identical to a previously tracked phase, and resets the count when the tracked phase is not identical to the previously tracked phase.

6. The device of claim 5, wherein the phase compensator determines the compensation phase according to whether the tracked phase is zero or not and then tracks the next phase when the count value is larger than a threshold value, and tracks the next phase without determining the compensation phase when the count value is not larger than the threshold value.

7. The device of claim 6, wherein the phase compensator decreases the compensation phase down to a predetermined minimum value when the tracked phase is zero, and increases the compensation phase up to a predetermined maximum value when the tracked phase is not zero.

8. The device of claim 5, wherein the frequency compensator recognizes that there is a frequency error and generates a first compensation frequency reflecting a short-term variation in the compensation phase when the tracked phase is not zero and the count value exceeds a threshold value.

9. The device of claim 8, wherein the frequency compensator generates a second compensation frequency reflecting a long-term variation in the compensation phase when the count value is larger than the threshold value and the accumulated quantity of the compensation phase exceeds a threshold phase.

10. A video signal processing system comprising:
    an analog-to-digital converter for converting an input analog video signal into a digital signal;
    a burst separator in signal communication with the analog-to-digital converter for extracting a burst signal from the digital signal;
    a subcarrier tracking unit in signal communication with the burst separator for tracking the phase of the extracted burst signal based on predetermined supposed phases, updating a compensation phase, and checking short-term and long-term variations in the compensation phase to determine a compensation frequency; and
    a Y/C separating and demodulating unit in signal communication with the subcarrier tracking unit for separating a luminance signal and a chrominance signal from the digital signal based on the compensation phase and the compensation frequency and generating a color signal for driving a display.

11. A method for tracking a subcarrier of a video signal, comprising:
using a phase comparator to track the phase of a burst signal based on predetermined supposed phases;
using a phase compensator to determine a compensation phase in response to the tracked phase; and
using a frequency compensator to determine a compensation frequency in response to a variation in the compensation phase.

12. The method of claim 11, wherein the phase of the burst signal is tracked in consideration of a frequency variation caused by the compensation frequency.

13. The method of claim 11, wherein the predetermined supposed phases are determined based on the compensation phase.

14. The method of claim 13, wherein the predetermined supposed phases include a positive value of the compensation phase, a negative value of the compensation phase, and zero.

15. The method of claim 11, wherein determining the compensation phase comprises:
increasing a count and determining that the compensation phase is updated in response to the increased count value when the tracked phase is identical to a previously tracked phase; and
resetting the count when the tracked phase is not identical to the previously tracked phase.

16. The method of claim 15, wherein determining the compensation phase comprises:
determining the compensation phase according to whether the tracked phase is zero or not, and then tracking the next phase when the count value is larger than a threshold value; and
tracking the next phase without determining the compensation phase when the count value is not larger than the threshold value.

17. The method of claim 16, wherein determining the compensation phase comprises:
decreasing the compensation phase down to a predetermined minimum value when the tracked phase is zero; and
increasing the compensation phase up to a predetermined maximum value when the tracked phase is not zero.

18. The method of claim 15, wherein determining the compensation frequency comprises recognizing that there is a frequency error and generating a first compensation frequency reflecting a short-term variation in the compensation phase when the tracked phase is not zero and the count value exceeds a threshold value.

19. The method of claim 18, wherein determining the compensation frequency comprises generating a second compensation frequency reflecting a long-term variation in the compensation phase when the count value is larger than the threshold value and the accumulated quantity of the compensation phase exceeds a threshold phase.

20. A video signal processing method comprising:
converting an input analog video signal into a digital signal;
extracting a burst signal from the digital signal;
tracking the phase of the extracted burst signal based on predetermined supposed phases and updating a compensation phase;
checking short-term and long-term variations in the compensation phase to determine a compensation frequency; and
separating a luminance signal and a chrominance signal from the digital signal based on the compensation phase and the compensation frequency.

* * * * *